United States Patent
Igel et al.

(10) Patent No.: US 6,765,394 B1
(45) Date of Patent: Jul. 20, 2004

(54) CAPACITIVE MAGNETIC FIELD SENSOR

(75) Inventors: Günter Igel, Teningen (DE); Ulrich Sieben, Reute (DE); Jürgen Giehl, Kirchzarten (DE)

(73) Assignee: Micronas GmbH, Hans Bunte Strasse (DE)

(*) Notice: Subject to any disclaimer, the term of this patent is extended or adjusted under 35 U.S.C. 154(b) by 0 days.

(21) Appl. No.: 09/868,538

(22) PCT Filed: Dec. 17, 1999

(86) PCT No.: PCT/EP99/10045
§ 371 (c)(1),
(2), (4) Date: Nov. 26, 2001

(87) PCT Pub. No.: WO00/37954
PCT Pub. Date: Jun. 29, 2000

(30) Foreign Application Priority Data

Dec. 19, 1998 (DE) .......................... 198 58 826

(51) Int. Cl.[7] .............................................. G01R 27/26
(52) U.S. Cl. ....................................... 324/661; 324/663
(58) Field of Search ................................ 324/240, 260, 324/650, 661, 663, 686, 687, 693

(56) References Cited

U.S. PATENT DOCUMENTS

| | | | |
|---|---|---|---|
| 4,680,544 A | | 7/1987 | Rudolf ........................ 324/259 |
| 5,036,286 A | | 7/1991 | Holm-Kennedy et al. .. 324/661 |
| 5,639,973 A | | 6/1997 | Okada .................... 73/862.043 |
| 5,739,686 A | | 4/1998 | Naughton et al. ........... 324/259 |
| 5,811,693 A | * | 9/1998 | Okada .................... 73/862.043 |
| 6,413,474 B1 | * | 7/2002 | Igel et al. ................. 422/82.05 |
| 6,462,566 B1 | * | 10/2002 | Schoefthaler et al. ....... 324/750 |
| 6,535,822 B2 | * | 3/2003 | Mansky et al. ............... 702/21 |
| 6,556,025 B1 | * | 4/2003 | Nathan et al. .............. 324/661 |

FOREIGN PATENT DOCUMENTS

| | | |
|---|---|---|
| DE | 69005685 | 1/1994 |
| DE | 19625078 | 1/1998 |
| WO | WO 97/31274 | 8/1997 |

OTHER PUBLICATIONS

Ayela et al., "A micromachined silicon magnetometer", Sensors and Actuators A 61, 339–341, 1991.

* cited by examiner

*Primary Examiner*—N. Le
*Assistant Examiner*—Walter Benson
(74) *Attorney, Agent, or Firm*—Gauthier & Connors LLP

(57) ABSTRACT

The invention relates to a capacitive magnetic field sensor. This sensor has a first electrode (2) and a second electrode (3), which are spaced apart from one another and which form a measurement capacitance. The first electrode (2) is situated on a first substrate body (4), and the second electrode (3) on a second substrate body (5). The second substrate body (5) is designed as a deformable membrane in the vicinity of the second electrode (3). A magnetic body (6) is situated in the vicinity of the second electrode (3) and the membrane, and is rigidly connected to the membrane and to the second electrode (3). As a result of this rigid connection, the influence of an external magnetic field on the magnetic body causes not only the magnetic body (6) to change its position but also causes the membrane and the second electrode (3) to change their position, since they are rigidly connected to said magnetic body. Because the second electrode (3) changes its position, its distance from the first electrode (2) changes, and thus the measurement capacitance, which acts as a measure of the externally applied magnetic field. This capacitive magnetic field sensor is distinguished by very small exterior dimensions, great mechanical stability, and low temperature dependence.

12 Claims, 1 Drawing Sheet

CAPACITIVE MAGNETIC FIELD SENSOR

BACKGROUND OF THE INVENTION

The present invention relates to the field of magnetic field sensors, and in particular to the field of capacitive magnetic field sensors.

Magnetic field sensors are often based on the Hall or magnetoresistive effect. These magnetic field sensors are extremely temperature dependent, and as a result they are not well suited for high-precision applications or else require expensive electronic or electrical temperature corrections.

Capacitive sensors are customarily used for measuring poses or accelerations. These generally prove to be mechanically very stable and have small exterior dimensions.

There is a need for a magnetic field sensor which depends less on interfering temperature effects.

SUMMARY OF THE INVENTION

A capacitive magnetic field sensor includes two electrodes, which are spaced apart from one another and which form a measurement capacitance. The first electrode is situated on a first substrate body, and the second electrode on a second substrate body. The second substrate body is designed as a deformable membrane in the vicinity of the second electrode, and has a magnetic body, which is rigidly connected to the membrane and to the second electrode. If the magnetic body is caused to change its position by an external magnetic field, this change of position is imparted to the membrane and to the second electrode through the rigid connection between the magnetic body, the membrane, and this second electrode. The distance between the two electrodes is thus changed, so that the measurement capacitance of the sensor changes as a function of the external magnetic field. This yields a reliable measurement of the magnetic field strength through the change of the capacitive properties of the sensor.

This type of structure of the magnetic field sensor significantly reduces its temperature dependence, since the elastic properties of the capacitive sensor are much less subject to temperature dependencies than the prior art sensors based on the Hall or magnetoresistive effect. Furthermore, the inventive capacitive magnetic field sensor proves to be mechanically very stable, not prone to trouble, and also has small external dimensions.

It proves to be especially advantageous to situate the second electrode and the magnetic body on different sides of the membrane. This excludes a mechanical or electrical direct effect of the magnetic body through the second electode due to the membrane which separates them. This arrangement also proves to facilitate manufacturability of the sensor, since the two sides of the membrane can be subjected to different production processes, which cannot mutually influence or disturb one another through their mechanical separation by the membrane. The production process for the capacitive magnetic field sensor is thus simplified and made economical.

The magnetic body can be constructed as a thin, flat layer, whose surface is joined to the membrane. This surface connection produces a very rigid arrangement of a layer-like magnetic body, the membrane, and the second electrode. This rigid structure of the various materials reduces the mechanical temperature dependence of the properties of the capacitive sensor.

Furthermore, this layer can be applied easily in the manner of an electrochemical deposition process, comparable to the process for applying printed circuits to circuit boards. This makes it possible to produce a layer with a defined thickness, and assures that a defined quantity of magnetic material is used for the magnetic body, a quantity which is sufficient to influence the position of the magnetic body adequately through the action of an external magnetic field and thus to determine the magnetic field strength. The use of ferromagnetic material has proven to be especially beneficial. Such material can be applied simply and securely by appropriately designing the deposition method.

According to a preferred embodiment of the capacitive magnetic field sensor, an electronic arrangement for processing the measurement signals is integrated into at least one of the substrate bodies. This integration takes the form of an integrated circuit. This assures that, in addition to the compact structure of the capacitive sensor, an electronic arrangement for evaluating the measurement signals is also present, which is characterized by low loss power in the path from the actual capacitive magnetic field sensor to the arrangement for processing the measurement signals and an especially good signal-to-noise ratio, and thus provides a differentiated evaluation and representation of the magnetic field strength. The capacitive magnetic field sensor thus proves to be a compact and reliable magnetic field sensor with high resolution. Such sensors are especially important in the automobile industry, where limited space is generally available.

The electronic arrangement for processing the measurement signal is preferably situated in the first substrate body below the electrode that is affixed thereto. This structure in the mechanically rigid, immobile first substrate body also assures a mechanically trouble-free electronic arrangement for processing the measurement signals. This significantly extends the field of application of this capacitive magnetic field sensor, and makes it especially suitable for the automobile industry or the aircraft industry.

It is especially advantageous to divide the electronic arrangement for processing the measurement signals and to situate the parts separately in the two different substrate bodies. Here, too, the electronic arrangement is preferably designed in the manner of an integrated circuit. Through this division, electronic functional groups such as amplifiers, evaluation units, or control units can be electronically decoupled from one another, and thus cross talk from one functional group to the other functional group can be prevented. Precisely in the case of very weak signals with especially poor signal-to-noise ratio, very accurate measurement results for the field strength nevertheless can be calculated and displayed, since now this arrangement for processing the measurement signals markedly reduces any impairment of the measurement results due to cross talk between amplification, evaluation, etc.

It has proven especially suitable to design the capacitive magnetic field sensor so that at least one of the electrodes is formed by conductor tracks on the respective substrate, which are preferably part of the electronic arrangement for processing the measurement signals. Through this design, the electrodes can be produced rather simply, and their form and dimension can be specifically adapted to the particular requirements. This yields a compact, reliable, and high-resolution capacitive magnetic field sensor. When the conductor track of the electronic arrangement is used both as an electrode and as an electronic element, it becomes possible to achieve a high degree of integration for the overall arrangement and to use this conductor track synergetically.

An especially advantageous capacitive magnetic field sensor has an electrode whose spatial structure makes it able to provide still more spatial resolution of the arrangement of the electrodes relative to one another, beyond their pure distance from one another. This makes it possible to show and make available to the user not only the pure magnetic field strength but also the orientation of the magnetic field or the time- or space-change of the magnetic field, by a space-resolving measurement. This aspect comes to bear when the two electrodes are not disposed parallel to one another through an external influence, e.g., the pattern of the magnetic field or the time- or space-change of the magnetic field, but rather are situated at an angle to one another and this angle changes through the flexible design of the membrane and/or the motion of the electrodes relative to one another. Such changes prove useful to the user of the capacitive magnetic field sensor, since he obtains additional information about the time or space behavior of the external magnetic field. Such information allows conclusions regarding the further actuation and/or amplification of the measurement signals. It has proven advantageous to dispose the electronic arrangement for the space-resolving processing of the measurement signals of the spatially structure electrode of the electronic arrangement for processing the measurement signals in one or in both substrates. Here, too, this arrangement proves to be especially advantageous both in terms of production engineering and as regards the compactness of the capacitive magnetic field sensor as well as regards its mechanical stability.

Although the present invention has been shown and described with respect to several preferred embodiments thereof, various changes, omissions and additions to the form and detail thereof, may be made therein, without departing from the spirit and scope of the invention.

DETAILED DESCRIPTION OF THE INVENTION

Figure 1:
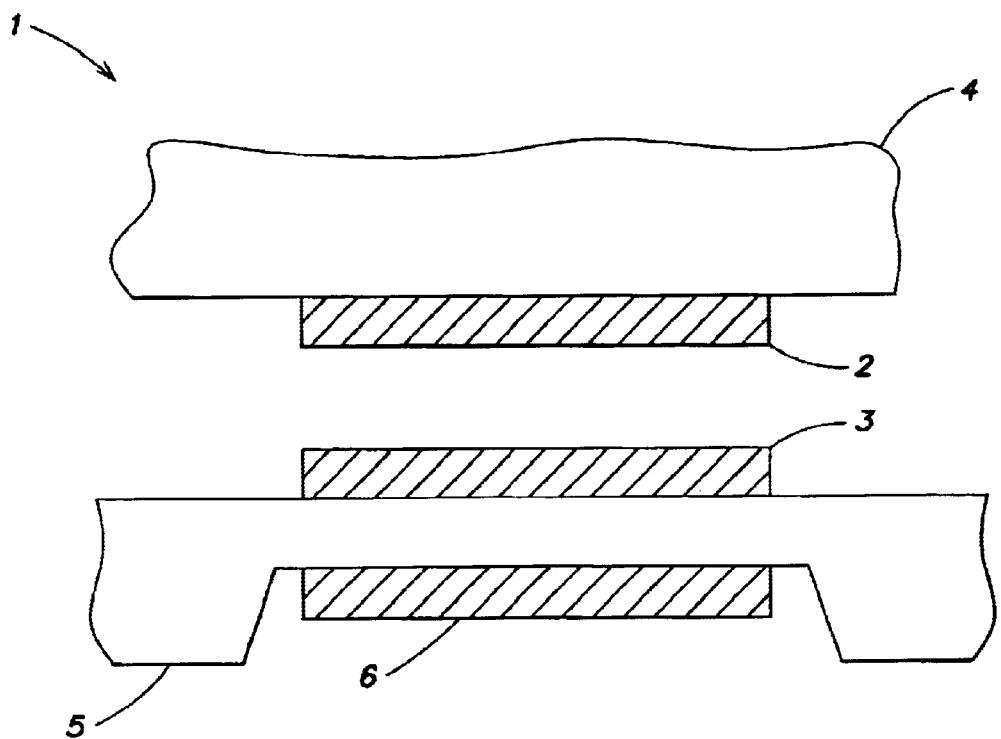
FIG. 1 is a cross sectional illustration of a capacitive magnetic field sensor.

FIG. 1 schematically illustrates a capacitive magnetic field sensor 1. The capacitive magnetic field sensor 1 includes a first electrode 2, which is situated on a first substrate body 4. A second electrode 3 is associated with the first electrode 2, and is situated at a distance therefrom. It is affixed to a second substrate body 5. The second substrate body 5 is designed as a membrane in the vicinity of the second electrode 3. In this way, the distance between the two electrodes 2 and 3 can change under the action of a force on the membrane, more or less depending on the type and hardness of the membrane. In this capacitive magnetic field sensor, a magnetic body 6 is situated on the backside of the membrane, that is on the side which faces away from the second electrode 3. Depending on an external magnetic field, said magnetic body applies a defined force on the membrane, and thus moves the membrane together with the second electrode 3, thereby changing the distance between the two electrodes 2 and 3. This change of distance causes a change in the capacitance of the arrangement consisting of the two electrodes 2 and 3. This change of capacitance is amplified and evaluated by an arrangement (not shown) for processing the measurement signals in the first substrate 4. The capacitive magnetic field sensor 1 thus makes it possible to reliably measure the field strength of the external magnetic field, without strong temperature dependencies.

Figure 2:
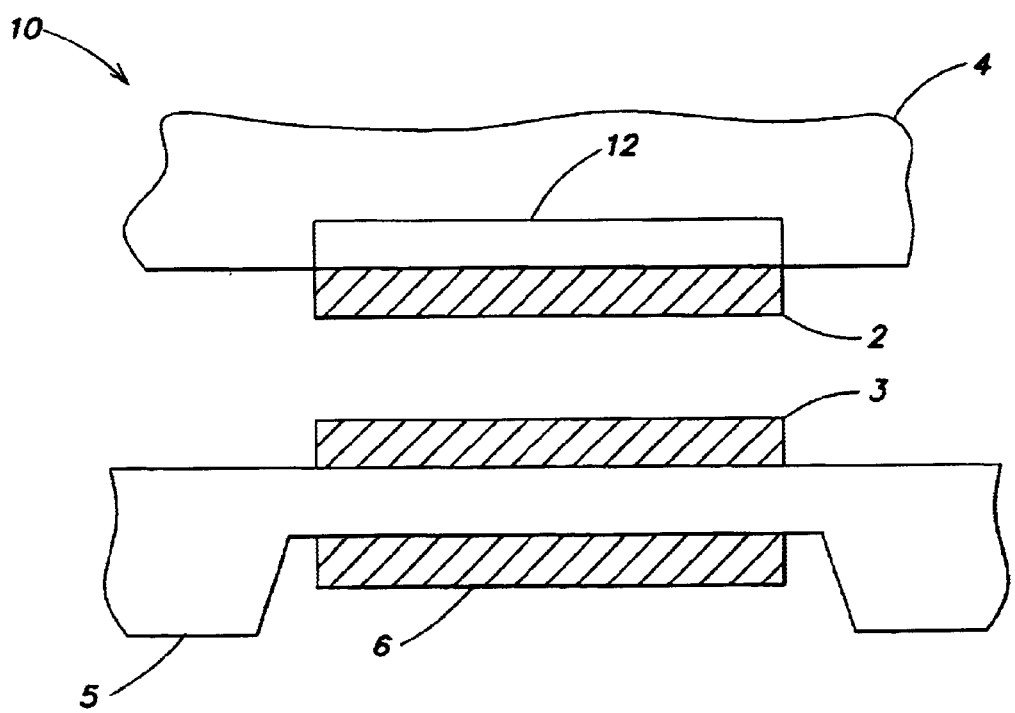
FIG. 2 is a more detailed cross sectional illustration of a capacitive magnetic field sensor.

FIG. 2 is a cross sectional illustration of a capacitive magnetic field sensor 10. The sensor illustrated in FIG. 2 is substantially the same as the sensor illustrated in FIG. 1, with the principal exception that the sensor 10 illustrated in FIG. 2 illustrates electronic arrangement 12 for processing the measurement signals.

Although the present invention has been shown and described with respect to several preferred embodiments thereof, various changes, omissions and additions to the form and detail thereof, may be made therein, without departing from the spirit and scope of the invention.

What is claimed is:

1. A capacitive sensor with a first electrode and a second electrode, which are spaced apart from one another and which form a measurement capacitance, such that the first electrode is situated on a first substrate body and the second electrode on a second substrate body, and the second substrate body is designed as a deformable membrane in the vicinity of the second electrode, characterized in that a magnetic body is disposed in the vicinity of the second electrode and the membrane, which magnetic body is connected to the membrane and to the second electrode in such a way that a change of position of the magnetic body, induced by an external magnetic field, will cause a change of position of the second electode via the membrane, resulting in a capacitance change, wherein sand capacitive sensor further comprises an electronic arrangement situated in the first substrate body below the first electrode affixed thereon for processing the measurements signals.

2. The capacitive sensor of claim 1, wherein the second electrode and the magnetic body are situated on opposite sides of the membrane.

3. The capacitive sensor of claim 2, wherein the magnetic body is formed as a thin layer.

4. The capacitive sensor of claim 3, wherein the magnetic body contains ferromagnetic material.

5. The capacitive sensor of claim 1, wherein a first part of the electronic arrangement for processing the measurement signals is situated in the first substrate body and a second part of the electronic arrangement for processing the measurement signals is situated in the second substrate body.

6. The capacitive sensor of claim 1, wherein the electronic arrangement for processing the measurement signals has elements to amplify the measurement signal.

7. The capacitive sensor of claim 1, wherein the electronic arrangement for processing the measurement signals has elements for applying a voltage signal across the first and second electrodes.

8. The capacitive sensor of claim 1, wherein at least one of the electrodes is formed as at least one conductor track.

9. The capacitive sensor of claim 8, wherein the conductor track is part of the electronic arrangement for processing the measurement signals.

10. The capacitive sensor claim 9, wherein the first electrode is configured and arranged with respect to the second electrode to provide a space-resolving measurement.

11. The capacitive sensor of claim 10, wherein the first electrode has mutually parallel, strip-shaped elements.

12. The capacitive sensor of claim 11, wherein the electronic arrangement for processing the measurement signals processes the measurement signals to provide the space-resolving measurement.

* * * * *

UNITED STATES PATENT AND TRADEMARK OFFICE
CERTIFICATE OF CORRECTION

PATENT NO. : 6,765,394 B1
DATED : July 20, 2004
INVENTOR(S) : Igel et al.

It is certified that error appears in the above-identified patent and that said Letters Patent is hereby corrected as shown below:

Column 1,
Line 14, replace "poses" with -- pressures --
Line 38, replace "signficantly" with -- significantly --
Line 50, replace "electode" with -- electrode --
Line 63, replace "depondence" with -- dependence --

Column 2,
Line 56, replace "signals" with -- signal --

Column 3,
Line 21, replace "structure" with -- structured --

Column 4,
Line 27, replace "electode" with -- electrode --
Line 28, replace "sand" with -- said --
Line 57, after "sensor" insert -- of --

Signed and Sealed this

Fourteenth Day of December, 2004

JON W. DUDAS
*Director of the United States Patent and Trademark Office*